(12) United States Patent
Nishiyama

(10) Patent No.: US 10,075,163 B2
(45) Date of Patent: Sep. 11, 2018

(54) CONTACT SENSING DEVICE

(71) Applicant: TOYOTA JIDOSHA KABUSHIKI KAISHA, Toyota-shi, Aichi-ken (JP)

(72) Inventor: Shigeki Nishiyama, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 307 days.

(21) Appl. No.: 14/891,840

(22) PCT Filed: May 20, 2014

(86) PCT No.: PCT/IB2014/000787
§ 371 (c)(1),
(2) Date: Nov. 17, 2015

(87) PCT Pub. No.: WO2014/188257
PCT Pub. Date: Nov. 27, 2014

(65) Prior Publication Data
US 2016/0087629 A1    Mar. 24, 2016

(30) Foreign Application Priority Data

May 21, 2013 (JP) ................................. 2013-107001

(51) Int. Cl.
*H03K 17/96*    (2006.01)
*G01R 27/26*    (2006.01)
(Continued)

(52) U.S. Cl.
CPC ......... *H03K 17/962* (2013.01); *E05B 1/0053* (2013.01); *E05B 81/76* (2013.01);
(Continued)

(58) Field of Classification Search
CPC ... H03K 17/962; G01R 27/26; G01R 27/2605
(Continued)

(56) References Cited

U.S. PATENT DOCUMENTS 7,635,989 B1 * 12/2009 Young ................. G06F 15/7867
326/39
2006/0170788 A1 * 8/2006 Melamud ............. H04N 5/3658
348/222.1
(Continued)

FOREIGN PATENT DOCUMENTS

CN    101490642 A    7/2009
CN    103034378 A    4/2013
(Continued)

*Primary Examiner* — Adi Amrany
(74) *Attorney, Agent, or Firm* — Oliff PLC

(57) ABSTRACT

A contact sensing device includes: a first electrode and a second electrode facing each other, a drive detection circuit of an electrostatic capacitance type, a first switching circuit that implements switching between connection and disconnection between the first electrode and ground, and a second switching circuit that implements switching between connection and disconnection between the first electrode and the second electrode. The drive detection circuit implements switching between a first state and a second state and detects an electrostatic capacitance change in the first state and an electrostatic capacitance change in the second state.

4 Claims, 8 Drawing Sheets

(51) Int. Cl.
*H03K 17/955* (2006.01)
*H03K 17/975* (2006.01)
*E05B 1/00* (2006.01)
*E05B 81/76* (2014.01)

(52) U.S. Cl.
CPC ......... *G01R 27/26* (2013.01); *G01R 27/2605* (2013.01); *H03K 17/955* (2013.01); *H03K 17/975* (2013.01); *H03K 2217/960705* (2013.01)

(58) Field of Classification Search
USPC ......... 307/116; 324/649, 658, 661, 679, 686
See application file for complete search history.

(56) References Cited

U.S. PATENT DOCUMENTS

| | | |
|---|---|---|
| 2007/0171057 A1 | 7/2007 | Ogino et al. |
| 2009/0267679 A1* | 10/2009 | Azuma ................. H03K 17/04 327/408 |
| 2010/0230181 A1 | 9/2010 | Suzuki |
| 2011/0057707 A1* | 3/2011 | Bronczyk ............ G01R 31/025 327/332 |
| 2011/0161593 A1* | 6/2011 | Yamazaki ........... G06F 12/0895 711/125 |
| 2011/0187202 A1* | 8/2011 | Chuang .................... H02B 1/00 307/115 |
| 2011/0254571 A1* | 10/2011 | Togura ..................... G01D 5/24 324/679 |
| 2012/0050180 A1 | 3/2012 | King et al. |
| 2013/0076375 A1 | 3/2013 | Hanumanthaiah et al. |

FOREIGN PATENT DOCUMENTS

| | | |
|---|---|---|
| JP | 2007-077797 A | 3/2007 |
| JP | 2009-133777 A | 6/2009 |
| JP | 2009-218876 A | 9/2009 |
| JP | 2010-139362 A | 6/2010 |
| JP | 2010-217967 A | 9/2010 |
| JP | 2011-106204 A | 6/2011 |
| JP | 2012-129762 A | 7/2012 |
| WO | 2008/009687 A2 | 1/2008 |

* cited by examiner

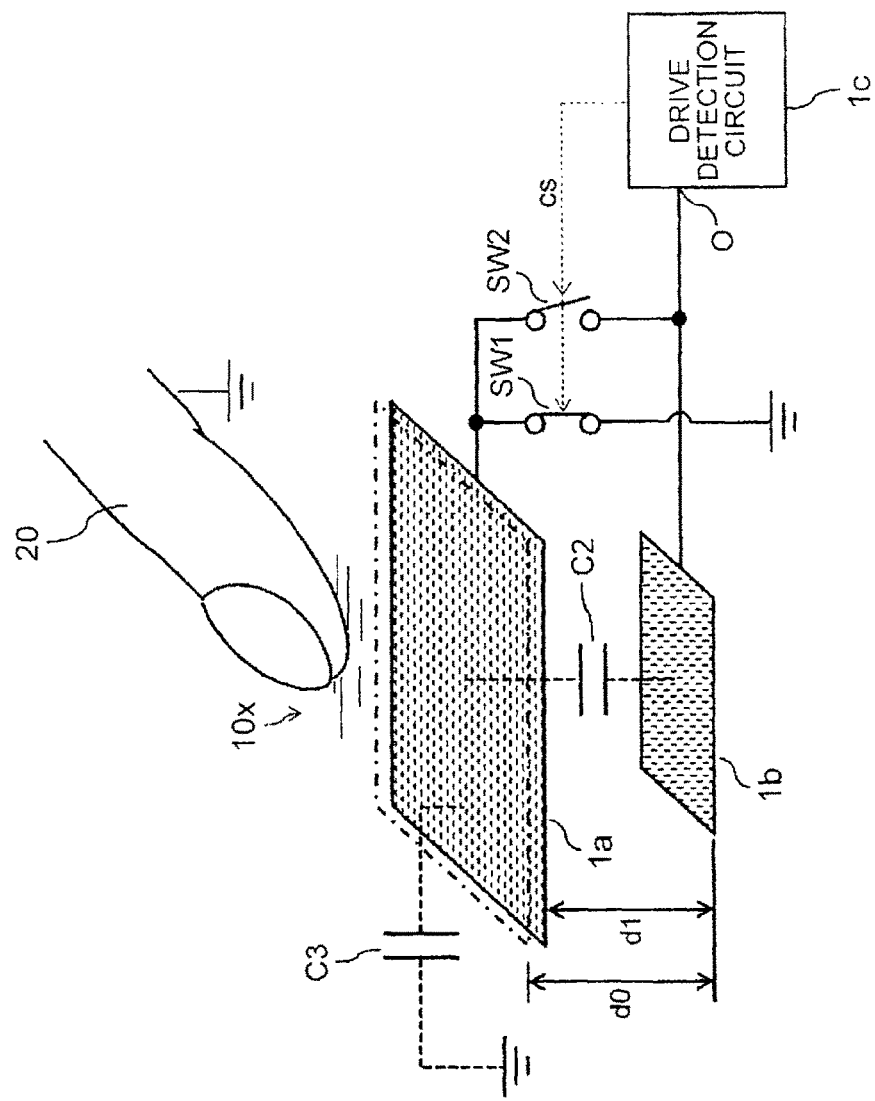

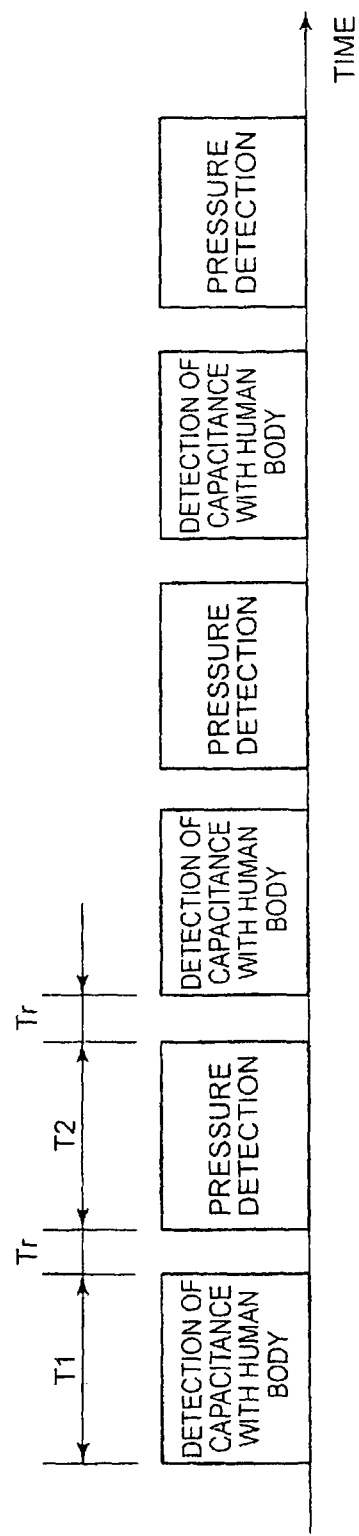

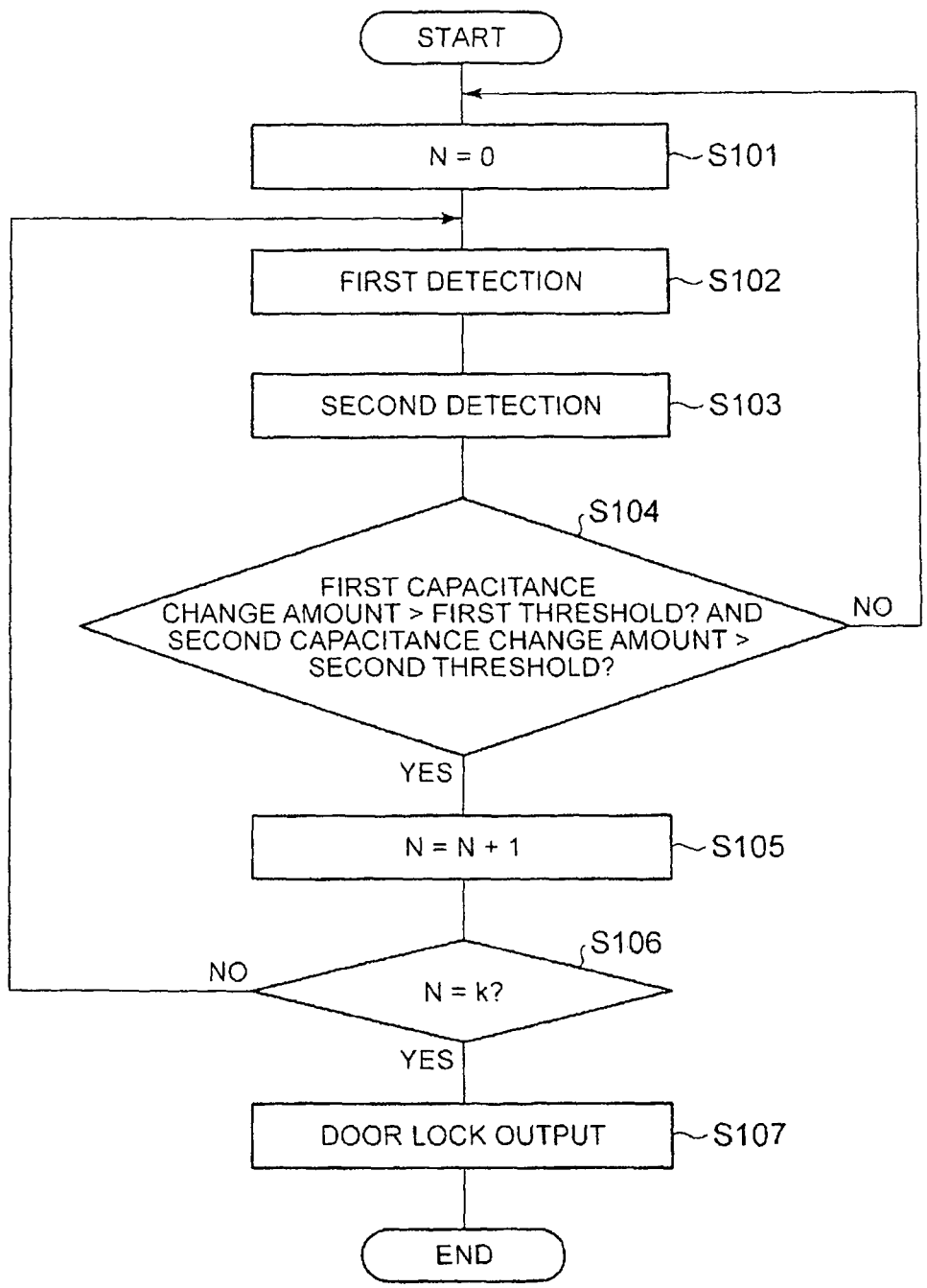

CONTACT SENSING DEVICE

BACKGROUND OF THE INVENTION

1. Field of the Invention

The invention relates to a contact sensing device that is mounted on a door handle of a vehicle.

2. Description of Related Art

A large number of vehicles equipped with a keyless entry system incorporating a contact sensing device of an electrostatic capacitance type has appeared on the market. In such a keyless entry system, the contact sensing device is provided at a door handle, and locking and unlocking of the door is controlled according to the contact sensing result.

As shown in FIG. 7A, in a standby state of the contact sensing device, a sensing electrode 101 is driven by a drive signal source 102, and the absence of changes in a capacitance C101 formed between the sensing electrode 101 and the ground (GND) is detected. Where a user's finger 103 approaches the sensing electrode 101, as shown in FIG. 7B, a capacitance C102 is formed between the sensing electrode 101 and the finger 103. Therefore, the contact between the user and the door handle is detected by detecting a change in capacitance corresponding to parallel addition of the capacitance C102 to the capacitance C101. The detection shown in FIG. 7B is performed provided that the user carrying an electronic key is present within a detection range determined by the keyless entry system.

Where the contact sensing device detects the contact with the user who has approached the vehicle from the outside, the vehicle system unlocks the door, and where the contact sensing device detects the contact with the user who steps out of the vehicle, the vehicle system locks the door.

As described in Japanese Patent Application Publication No. 2010-139362 (JP 2010-139362 A), Japanese Patent Application Publication No. 2009-133777 (JP 2009-133777 A), Japanese Patent Application Publication No. 2007-077797 (JP 2007-077797 A), Japanese Patent Application Publication No. 2012-129762 (JP 2012-129762 A), and Japanese Patent Application Publication No. 2009-218876 (JP 2009-218876 A), the change in electrostatic capacitance caused by rain drops that have adhered to the door handle surface in the rain can be erroneously detected by the aforementioned contact sensing device as the contact with the user. The reason for such erroneous detection caused by rain drops is described below.

FIG. 8A is a cross-sectional view taken by cutting a door handle 104 in the vertical direction. The sensing electrode 101 is disposed inside the door handle 104 at a distance from an outer case surface 104a of the door handle. The sensing electrode 101 forms a capacitance Ca with the outer case surface 104a, and the outer case surface 104a forms a capacitance Cb with a body sheet 105 serving as a grounding conductor. Therefore, the capacitance C101 can be generally represented as a series-combined capacitance of the capacitance Ca and the capacitance Cb. By contrast, as shown in FIG. 8B, where a rain drop D adheres to the outer case surface 104a in the rain, the outer case surface 104a and the body sheet 105 form a capacitance Cb' in a state in which the rain drop is interposed therebetween.

The state between the sensing electrode 101 and the outer case surface is the same in FIGS. 8A and 8B, but between the outer case surface and the body sheet 105, the air is present in FIG. 8A, whereas the rain drop is present in FIG. 8B. Since the relative dielectric constant $\varepsilon_r$ of air is taken as 1 and the dielectric constant $\varepsilon_r$ of water is about 80, the equation $C = \varepsilon_r \varepsilon_0 \times S/d$ representing the capacitance of a parallel flat capacitor (here, $\varepsilon_0$ is the dielectric constant of vacuum, S—the electrode surface area and d—the distance between the electrodes) indicates that the capacitance Cb' realized when the rain drop has adhered is correspondingly larger than the usual capacitance Cb. Where the contact sensing device detects the change in C (water), which is the value of the capacitance C101 in FIG. 8B, with respect to the C (air), which is the value of the capacitance C101 in FIG. 8A, at the same level as the change in capacitance caused by the contact with the user's finger 103, the contact can be erroneously detected even when there is no contact with the user.

Accordingly, JP 2010-139362 A suggests using a shift in probability distribution of a capacitance change amount caused by the adhesion of rain drops, and shifting a threshold used for comparing the capacitance change amount for determining the presence/absence of contact during raining. Further, JP 2009-133777 A suggests decreasing the contact detection sensitivity in a location on the door handle where rainwater is likely to remain. JP 2007-077797 A, JP 2012-129762 A, and JP 2009-218876 A also suggest contact sensing devices configured to avoid erroneous detection caused by water.

However, when a large amount of water covers the vehicle, as in the case where the vehicle is washed in an automatic washing facility or by a high-pressure water jet, with the contact sensing devices of an electrostatic capacitance type of the related art, a state is realized which is close to that when a person touches a door handle and, therefore, the erroneous detection is difficult to avoid. When the vehicle is washed in an automatic washing facility, the user is most often inside the vehicle cabin, but when the vehicle system erroneously detects the water sprayed from the outside of the vehicle cabin as the user's contact, this is erroneously detected as a state in which an electronic key is left inside the vehicle, and a malfunction of issuing a warning with a hazard lamp or a buzzer can be performed. Further, when the user spray washes the vehicle intensively from the outside of the vehicle, the vehicle system can malfunction and unlock the doors, although the user has no intention to enter the vehicle. The resultant inconvenience for the user is that measures based on his/her own judgment should be taken with respect to such an answerback from the vehicle system. The abovementioned erroneous detection and malfunction can also occur during a storm such as typhoon.

SUMMARY OF THE INVENTION

It is an objective of the invention to provide a contact sensing device of an electrostatic capacitance type that can prevent erroneous detection even when a large amount of water covers a vehicle.

An aspect of the invention relates to a contact sensing device of an electrostatic capacitance type that detects contact of a human body with a door handle, including: a first electrode and a second electrode disposed inside the door handle and facing each other; a drive detection circuit that drives an electrode connected to a drive detection terminal by the electrostatic capacitance type and detects an electrostatic capacitance change; a first switching circuit that implements switching between connection and disconnection between the first electrode and GND; and a second switching circuit that implements switching between connection and disconnection between the first electrode and the second electrode, wherein the drive detection circuit implements switching between a first state and a second state and detects an electrostatic capacitance change in the first state and an electrostatic capacitance change in the second state. The first state is a state in which the second electrode is connected to the drive detection terminal, the first electrode and the GND are disconnected from each other by the first switching circuit, and the first electrode and the second electrode are connected to each other by the second switching circuit. The second state is a state in which the first electrode and the GND are connected to each other by the first switching circuit and the first electrode and the second electrode are disconnected from each other by the second switching circuit.

According to the aspect, since the contact sensing device can detect the electrostatic capacitance change caused by the proximity effect of a physical body to the door handle in the first state, the possibility of contact between the human body and the door handle can be detected even when water covering the door handle is present. Further, in the second state, as a result of contact with the door handle, the geometric arrangement of the first electrode and second electrode in the contact sensing device is changed, thereby making it possible to detect the electrostatic capacitance change. The geometric arrangement inside the contact sensing device is unlikely to be changed by a large amount of water, and the detection of changes in the geometrical arrangement caused by unintentional collision with physical bodies can be excluded in conjunction with the result of electrostatic detection in the first state. Therefore, contact with the human body can be accurately identified. It follows from the above that a contact sensing device of a electrostatic capacitance type can be provided such that erroneous detection can be prevented even when the vehicle is covered with a large amount of water.

Further, the distance between the first electrode and the second electrode may be changed by pressure application to the outer surface of the door handle.

The geometric arrangement of the first electrode and second electrode inside the contact sensing device can be easily changed by contact between the human body and the door handle.

The first electrode may have a surface area larger than that of the second electrode.

Since the electrostatic capacitance formed between the second electrode and the human body by bypassing the first electrode becomes negligibly small, the electrostatic capacitance between the second electrode and the rainwater that has adhered to the door handle because the door handle has been covered with water also becomes negligibly small. Therefore, even when the change of electrostatic capacitance is very small due to a very small change in the inter-electrode distance in the second state, the change in the electrostatic capacitance may be detected with good accuracy.

Further, a substance having a dielectric constant larger than that of air may be interposed between the first electrode and the second electrode.

In the second state, the electrostatic capacitance formed between the first electrode and the second electrode can be increased. Therefore, pressure detection sensitivity and detection accuracy can be increased. Further, since the electrostatic capacitance can be increased in a state in which the increase in the electrode surface area is inhibited, the device housing can be reduced in size and good operability can be ensured.

Further, the detection of the electrostatic capacitance change in the first state and the detection of the electrostatic capacitance change in the second state may be performed alternately a predetermined number of times, and it may be determined that the human body has come into contact with the door handle when changes in the electrostatic capacitance in the first state and the second state are all detected to correspond to the contact of the human body with the door handle over the predetermined number of times.

Where the human body conies into contact with the door handle, the contact state is maintained for a certain time. Therefore, where a first period and a second period are switched to be repeated a predetermined number of times, the contact with the human body can be continuously determined and erroneous detection caused by noise can be eliminated.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 4 is a circuit diagram illustrating an embodiment of the invention and explaining the first state of the contact sensing device;

FIG. 5 illustrates an embodiment of the invention and explains the operation sequence of the contact sensing device;

FIG. 6 is a flowchart illustrating an embodiment of the invention and explaining the operation of the contact sensing device;

DETAILED DESCRIPTION OF EMBODIMENTS

An embodiment of the invention is explained below with reference to the appended drawings.

Figure 2:
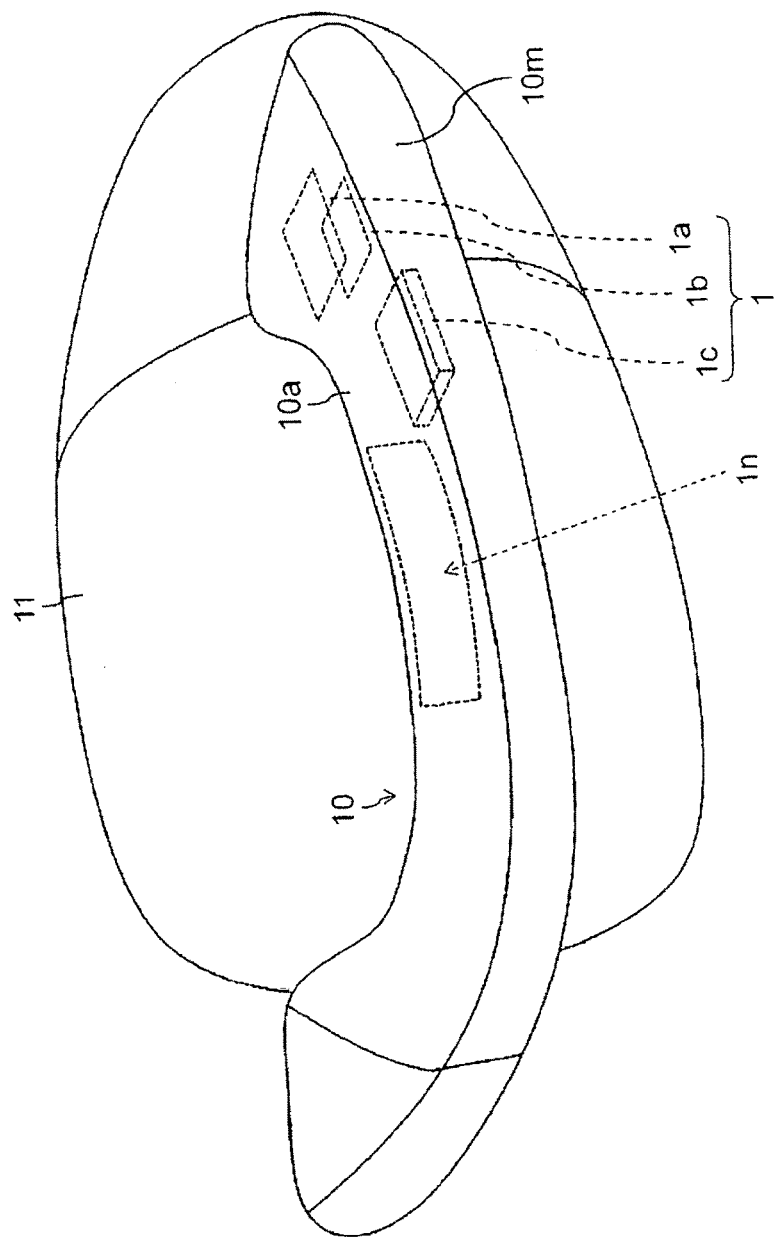
FIG. 2 is a see-through perspective view of the vicinity of a door handle that illustrates an embodiment of the invention and explains the arrangement of the contact sensing device.

FIG. 2 is a general view of the configuration of a door handle 10 according to the embodiment. In this case, the attention is focused on the arrangement of a contact sensing device 1 in the door handle 10.

The door handle 10 is shown as a door handle of a driver door. The contact sensing device 1 is a device of an electrostatic capacitance type, and a region (see FIG. 1) to be contacted by the user's finger is set at the upper surface close to the front end of the door handle 10. The contact sensing device 1 is provided with an electrode 1a, an electrode 1b, and a drive detection circuit 1c. The electrode In is provided at a position which is set inward of the door handle 10 from an outer case surface 10a, so as to face the abovementioned region. Other members of the contact sensing device 1 are disposed inside the door handle 10 with reference to the position of the electrode 1a. Thus, the electrode 1b is disposed below the electrode 1a and opposite thereto, and the drive detection circuit 1c is provided at a circumferential location on the side or below the electrode 1a and the electrode 1b.

Figure 1:
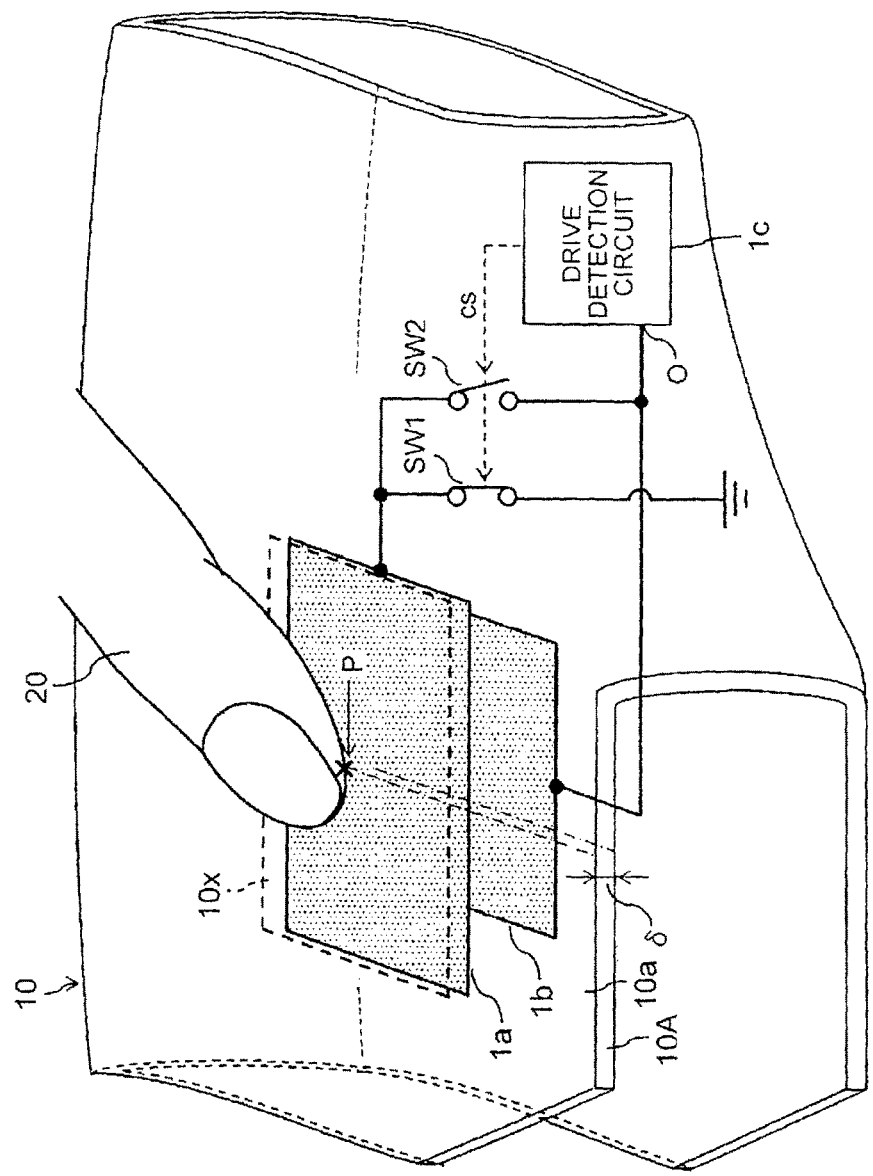
FIG. 1 is a see-through perspective view illustrating an embodiment of the invention and showing the configuration of a contact sensing device.

FIG. 1 shows the detailed configuration of the contact sensing device 1. For the convenience of illustration, the door handle 10 is appropriately cut, only the circumference where the contact sensing device 1 is provided is taken out, and the members of the contact sensing device 1 are shown by solid lines in a state in which the interior of the door handle 10 is seen through.

The region to be contacted by a user's finger (human body) 20 in the door handle 10 is provided to be visible as a pad region 10x. The electrode (first electrode) la is mounted on the inner surface of a resin body with a thickness δ that constitutes a case 10A, so that the resin body is interposed between the electrode and the outer case surface 10a of the door handle 10. Thus, a distance equal to δ is maintained between a site P on the pad region 10x, which is contacted by the finger 20, and the electrode 1a. The electrode 1a is formed to have a surface area larger than that of the electrode 1b, and the electrode (second electrode) 1b is fixed so as to be accommodated in a region directly below the electrode 1a and arranged opposite thereto.

In FIG. 1, the interior of the case 10A surrounded by the resin body is shown as an empty space, but a dielectric having a dielectric constant (relative dielectric constant) larger than that of air, in particular, a substance with a high dielectric constant, such as an urea resin or Rochelle salt, may be interposed between the electrode 1a and the electrode 1b. The distance between the electrode 1a and the electrode 1b is changed when the outer case surface 10a is pushed by the finger 20 and the case 10A is deformed.

The drive detection circuit 1c performs a drive detection operation by an electrostatic capacitance method such as a switched capacitor method. In FIG. 1 this circuit is shown as a block outlining the circuit, and the shape and arrangement thereof are not specified. Since a conventional circuit can be used for, such drive detection operation, it is not explained herein in detail. The drive detection circuit 1c can be controlled, for example, by a door lock sensor and a door lock electronic control unit (ECU). The drive detection circuit 1c drives, by the abovementioned electrostatic capacitance method, at least either of the electrodes connected to a drive detection terminal O, as described hereinbelow, from among the electrode 1a and the electrode 1b. The change of the connected electrostatic capacitance is detected through the drive detection terminal O. The other terminal of the electrostatic capacitance that forms a pair with the drive detection terminal O, which is the one terminal, is a reference potential terminal such as GND (this terminal is not shown in the figure).

The electrode 1b is connected at all times to the drive detection terminal O. The contact sensing device 1 is provided with a switching circuit (first switching circuit) SW1 and a switching circuit (second switching circuit) SW2 that switch the connection state of the electrode 1a with the drive detection terminal O and the electrode 1b. The switching circuit SW1 switches connection/disconnection between the electrode 1a and the OND. The switching circuit SW2 switches connection/disconnection between the electrode 1a and the electrode 1b, that is, the drive detection terminal O. The switching circuit SW1 and the switching circuit SW2 are controlled by a complementary logic such that the connection state and disconnection state are alternately reversed, for example, by the same control signal cs outputted from the drive detection circuit 1c. Examples of such switching circuit SW1 and switching circuit SW2 include an n-channel field effect transistor and a p-channel field effect transistor, and also a pnp bipolar transistor and an npn bipolar transistor. The switching circuit SW1 and the switching circuit SW2 may be also controlled by respective independent control signals. In this case, transistors of the same polarity can be used as the switching circuit SW1 and the switching circuit SW2. The drive detection circuit 1c continues the operation of periodically switching the connection state with the switching circuit SW1 and the connection state with the switching circuit SW2 in a standby state and also in a state of contact with the user.

The electrode 1a in the abovementioned example is provided such as to face the upper surface of the door handle 10, but this electrode may be also provided so as to face other location, for example, a side surface 10m of the door handle 10 which is farther from the door panel 11, as shown in FIG. 2. Further, the electrode 1a in the abovementioned example is explained without distinguishing between the applications for locking and unlocking the door, but it is also possible to provide separately an electrode In on the side surface of the door handle 10 on the door panel 11 side, and use the electrode 1a as a sensing electrode for locking and use the electrode 1n as a sensing electrode for unlocking as shown in FIG. 2. The electrode 1n is also combined with one more electrode forming a pair therewith, in the same manner as with the electrode 1b.

The operation of the contact sensing device 1 of the above-described configuration is explained below with reference to FIGS. 3 to 6. Considered below is a state when the user's finger 20 touches the pad region 10x after the electronic key has been recognized by the vehicle system.

Figure 3:
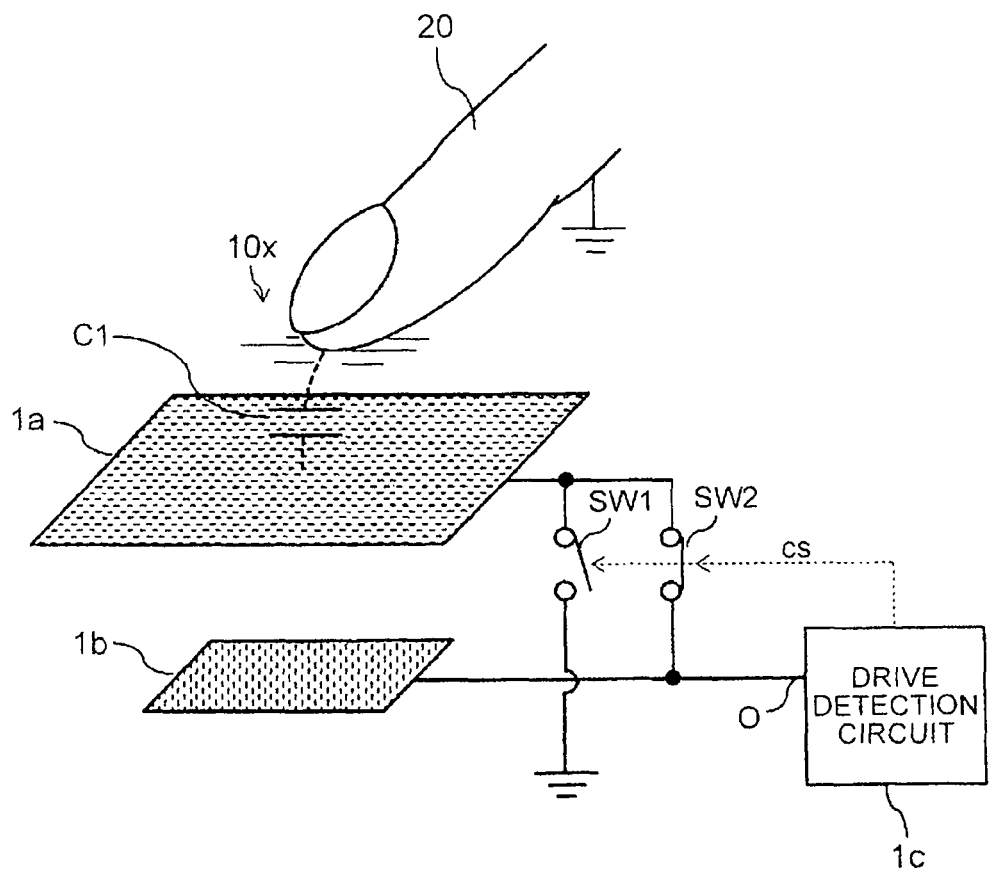
FIG. 3 is a circuit diagram illustrating an embodiment of the invention and explaining the first state of the contact sensing device.
Figure 7A:
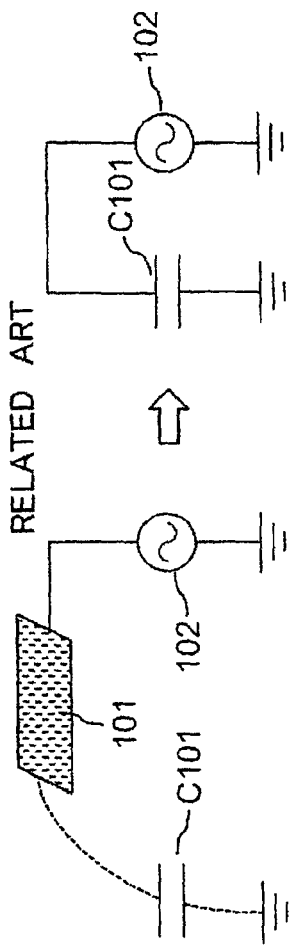
FIG. 7A is a circuit diagram in a standby state that illustrates the related art.
Figure 7B:
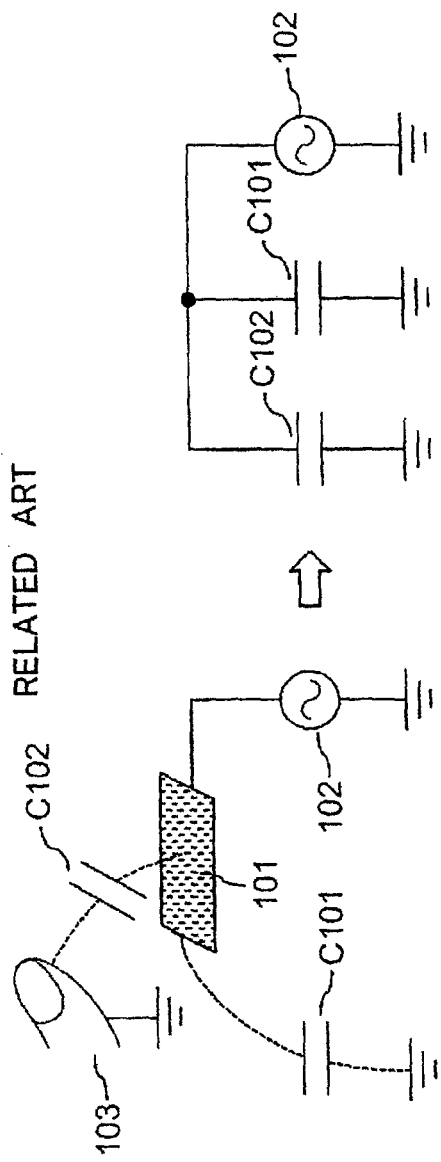
FIG. 7B is a circuit diagram in a state of contact with a human body that illustrates the related art.
Figure 8A:
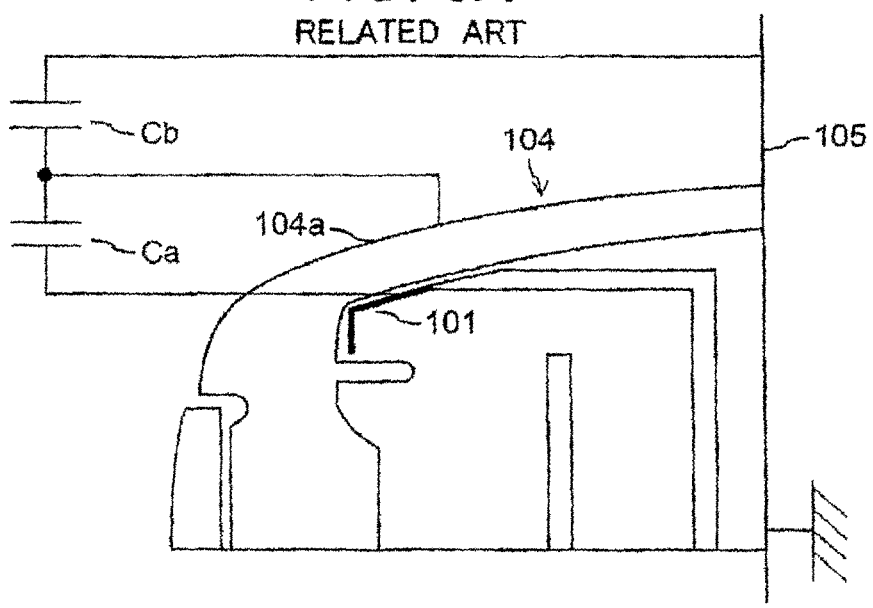
FIG. 8A illustrates the related art and explains a state in which the door handle is not covered with water.
Figure 8B:
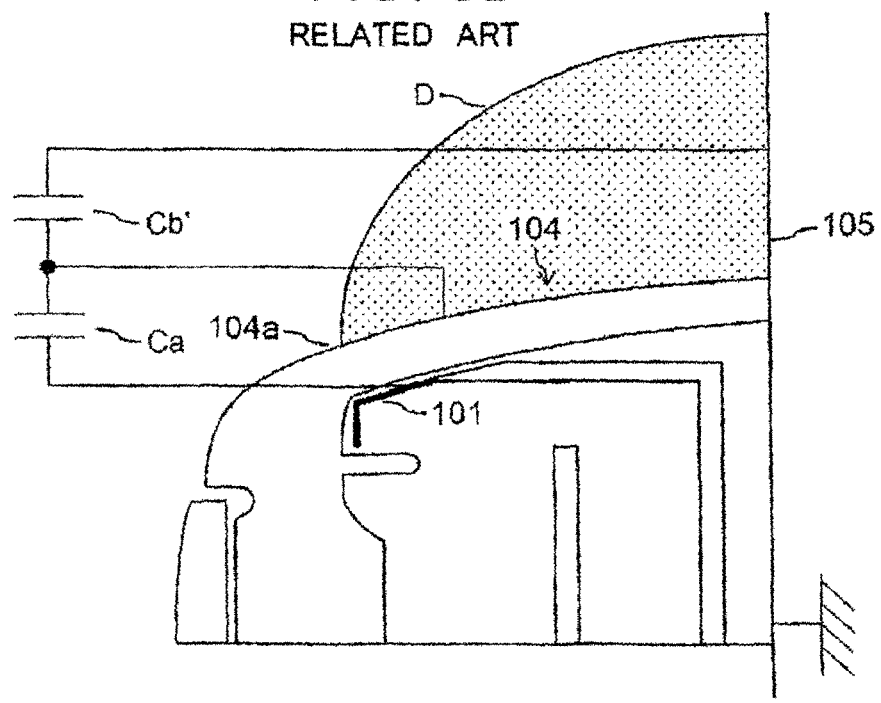
FIG. 8B illustrates the related art and explains a state in which the door handle is covered with water.

A state in which the electrode 1a and the GND are disconnected from each other by the switching circuit SW1, and the electrode 1a and the electrode 1b are connected to each other by the switching circuit SW2, as shown in FIG. 3, is referred to as the first state. In the first state, the electrostatic capacitance C1 is formed between the finger 20 and the electrode 1a connected to the electrode 1b. The drive detection circuit 1c performs the operation of applying a drive voltage to the electrostatic capacitance C1 connected to the drive detection terminal O and determining, by comparison with the first time threshold, the duration of time till a reference voltage is reached inside the drive detection circuit 1c. Where a change amount of electrostatic capacitance exceeding a threshold (first threshold corresponding to the first time threshold) is detected by comparing with the electrostatic capacitance that has been formed between the GND (body sheet) and the electrode 1a connected to the electrode 1b before the finger 20 touches the pad region 10x, it is determined that the user could touch the door handle 10. Such change amount of electrostatic capacitance that exceeds the threshold can be also detected when the vehicle is covered with water.

A state in which the electrode 1a and the GND are connected to each other by the switching circuit SW1, and the electrode 1a and the electrode 1b are disconnected from each other by the switching circuit SW2, as shown in FIG. 4, is referred to as the second state. In the second state, the electrostatic capacitance C2 is formed between the electrode 1a and the electrode 1b. In this state, in the same manner as in the first state, when the finger 20 is pressed against the pad region 10x, the case 10A is deformed, the electrode 1a displaces downward, and the distance (inter-electrode distance) between the electrode 1a and the electrode 1b decreases from d0 before the pressure was applied by the finger 20 to d1 (d1<d0). As a result, as follows from the equation above that represents the capacitance of the parallel flat capacitor, the electrostatic capacitance C2 becomes larger than the value in the standby state. Further, since the electrode 1a is connected to the GND, the effective electrostatic capacitance C3 is not formed between the electrode 1a and the GND (body sheet). Further, the electrode 1b can form the electrostatic capacitance with the finger 20 by bypassing the circumference of the electrode 1a, but since the surface area of the electrode 1a is increased over that of the electrode 1b, the electrostatic capacitance formed between the electrode 1b and the finger 20 is negligibly small. In particular, where the electrode 1b is accommodated in the region directly below the electrode 1a, the electrostatic capacitance formed between the electrode 1b and the finger 20 can be made even smaller.

The drive detection circuit 1c performs the operation of applying a drive voltage to the electrostatic capacitance C2 connected to the drive detection terminal O and determining, by comparison with the second time threshold, the duration of time till a reference voltage is reached inside the drive detection circuit 1c. Where a change amount of electrostatic capacitance exceeding a threshold (second threshold corresponding to the second time threshold) is detected by comparing with the electrostatic capacitance C2 formed when the inter-electrode distance is d0, it is determined that the user has touched the door handle 10. The change amount of electrostatic capacitance that exceeds the threshold is such that cannot be caused by the application of water pressure to the vehicle when the vehicle is covered with a large amount of water as a result of setting the rigidity of the case 10A. Since the electrostatic capacitance formed between the electrode 1b and the finger 20 is reduced as mentioned hereinabove, the electrostatic capacitance between the electrode 1b and the rainwater, which is caused by the water covering the door handle 10, is also reduced to a negligibly small level. Therefore, in the second state, even though the change in the electrostatic capacitance C2 is very small due to a very small change in the inter-electrode distance, the change in the electrostatic capacitance C2 can be detected with good accuracy.

Further, as described hereinabove, the electrostatic capacitance C2 can be increased by interposing a dielectric with a relative dielectric constant greater than 1, primarily a substance with a high dielectric constant, between the electrode 1a and the electrode 1b. Therefore, pressure detection sensitivity and detection accuracy can be increased. As a result, the electrostatic capacitance C2 can be increased in a state in in which the increase in electrode surface area is inhibited. Therefore, the device housing can be reduced in size and good operability can be ensured. Another effect that can be obtained with the configuration in which a dielectric is inserted between the electrode 1a and the electrode 1b is that the electrodes can be fixed in a state in which a pressure-induced displacement is allowed.

Thus, in the embodiment, the contact sensing device 1 is initially set into the first state and it is detected whether or not the electrostatic. capacitance C1 has changed from the standby state to exceed the first threshold. Then, the contact sensing device 1 is set into the second state and it is detected whether or not the electrostatic capacitance C2 has changed from the standby state to, exceed the second threshold. Where the capacitance change that exceeds both the first threshold and the second threshold is detected, it is determined that the user has come into contact with the door handle 10. The capacitance change in the first state is determined by the proximity effect of the physical body to the door handle 10, and the capacitance change in the second state is determined by the change of the geometric arrangement of the electrode 1a and the electrode 1b inside the contact sensing device 1 corresponding to the pressure applied to the door handle 10.

The geometric arrangement inside the contact sensing device 1 is unlikely to be changed by a large amount of water, and the detection of changes in the geometrical arrangement caused by unintentional collision with physical bodies can be excluded in conjunction with the result of electrostatic, detection in the first state. Therefore, contact with the human body can be accurately identified. It follows from the above that a contact sensing device of an electrostatic capacitance type can be provided such that erroneous detection can be prevented even when the vehicle is covered with a large amount of water. Further, the effect of making the geometric arrangement unlikely to change when the vehicle is covered with water is particularly significant when the position of the electrode 1a explained in FIG. 2 faces the upper surface of the door handle 10.

Further, the determination operation in the first state and the second state can be performed by the drive detection circuit 1c, but it can be also implemented in the control circuit such as the door lock ECU controlling the drive detection circuit 1c by performing, as necessary, the analog-to-digital (AD) conversion from the detection result outputted from the drive detection circuit 1c.

Further, the door handle corresponding to the keyless entry system such as shown in FIG. 2 is configured of an outer portion (case 10A) constituting a design surface and an inner assembly of the detection circuit and sensor electrodes (electrode 1a, electrode 1b, drive detection circuit 1c, etc.). The products in which the, sensor electrode shape is changed for each design should have been conventionally prepared as the inner assemblies, but with the door handle 10 of the embodiment, an inner assembly of one type can be shared by all designs since the electrode (electrode 1a) on the side close to the operation portion is molded integrally with the outer portion.

The sequence of the abovementioned capacitance sensing operation, contact detection operation, and door locking-unlocking control is explained below.

As shown in FIG. 5, the execution of the capacitance sensing operation and contact detection operation is switched such that a first period T1 relating to the first state in which the capacitance formed with the human body is detected and a second period T2 relating to the second state in which the pressure applied to the door handle 10 is detected are repeated a plurality of times. In other words, in each first period T1, the contact sensing device 1 is set to the first state, the capacitance variation amount induced by the electrostatic capacitance C1 is detected, and the possibility of the user coming into contact with the door handle 10 is determined. In each second period T2, the contact sensing device 1 is set to the second state, the capacitance variation amount induced by the electrostatic capacitance C2 is detected, and whether or not the user has come into contact with the door handle 10 is determined. Where the user comes into contact with the door handle 10, the contact state is maintained for a certain time. Therefore, where the first period T1 and the second period T2 are repeated a predetermined number of times at an interval of several milliseconds, the contact with the user can be continuously determined and the erroneous detection caused by noise can be eliminated. The length of each period is the same as the response time in a contact sensing device of the related art. Therefore, the detection processing circuit of the related art can be used for detecting the capacitance change amount. A reset period Tr for returning the electric charges of the electrode 1a and the electrode 1b to the initial state is provided between the first period T1 and the second period T2.

FIG. 6 shows a flowchart explaining the operation of the contact sensing device 1 incorporating the sequence shown in FIG. 5. Steps S101 to S106 described hereinbelow may be executed to completion in the contact sensing device 1, or any of the steps may be executed by a control circuit such as the door lock ECU. The control may be executed by hardware alone, or with a computer configuration in which a processor reads a program describing the operations of those steps from the memory and executes the program. Where the control circuit relates to control, the control circuit is included in a member constituting the contact sensing device 1.

In the state considered hereinbelow, the contact sensing device 1 executes the sequence shown in FIG. 5 at all times, regardless of whether an ignition power source is ON or OFF. In step S101, an initial value of 0 is introduced as the number N of contacts of the user with the door handle 10 that is determined through a pair of periods constituted by the first period T1 and the very next second period T2. In step S102, the detection (first detection) in the first period T1 is performed, and then in step S103, the detection in the second period T2 (second detection) is performed.

In step S104, it is determined whether or not the capacitance change amount (first capacitance change amount) caused by the formation of the electrostatic capacitance C1 exceeds the first threshold on the basis of the result of detection in step S102, and it is also determined whether or not the capacitance change amount (second capacitance change amount) of the electrostatic capacitance C2 exceeds the second threshold on the basis of the result of detection in step S103. Where it is determined in step S104 that the first capacitance change amount exceeds the first threshold and the second capacitance change amount exceeds the second threshold, the processing advances to step S105, and where the first capacitance change amount does not exceed the first threshold or the second capacitance change amount does not exceed the second threshold, the processing returns to step S101.

In step S105, N is incremented by 1. Then, in step S106, it is determined whether or not N has reached a specified number k corresponding to the predetermined number of times. Where N has reached k, it is finally determined that the user has come into contact with the door handle 10, and the processing advances to step S107. Where N has not reached k, the processing returns to step S102.

In step S107, the determination that the user has come into contact with the door handle 10 is received, and the door lock ECU performs a door lock output. Thus, the door lock ECU locks the door in a situation corresponding to door locking and unlocks the door in a situation corresponding to door unlocking. The series of control operations from the user contact detection to the door locking or unlocking is thereby ended.

In the operation sequences shown in FIGS. 5 and 6, the order of the first period T1 and the second period T2 may be reversed.

Where the contact sensing device 1 executes the sequence shown in FIGS. 5 and 6 at all times, regardless of ON/OFF of the vehicle power supply, as in the above-described example, the contact sensing device 1 performs the operation even when a user who is unaware that the vehicle power source is not switched off, as can happen in a vehicle with a low operation noise when the vehicle power source is ON, such as a hybrid vehicle, locks or unlocks the door. Therefore, adequate contact detection can be performed at all times. Further, with the object of reducing power consumption, the operation power may be also supplied to the contact sensing device 1 only when necessary, The invention can be generally used in vehicles equipped with a security function.

The invention claimed is:

1. A contact sensing device of an electrostatic capacitance type that detects contact of a human body with a door handle, the device comprising:
    a first electrode and a second electrode that are disposed inside the door handle and that face each other, a distance between the first electrode and the second electrode being changed by pressure application to an outer surface of the door handle;
    a first switching circuit that implements switching between connection and disconnection between the first electrode and ground;
    a second switching circuit that implements switching between connection and disconnection between the first electrode and the second electrode; and
    a drive detection circuit that drives an electrode connected to a drive detection terminal and detects a change in electrostatic capacitance, the drive detection circuit implementing switching between a first state and a second state at predetermined time intervals and detecting an electrostatic capacitance change in the first state and an electrostatic capacitance change in the second state to determine contact of a human body with the door handle if the electrostatic capacitance change in the first state exceeds a first threshold and the electrostatic capacitance change in the second state exceeds a second threshold,
    the first state being a state in which the second electrode is connected to the drive detection terminal, the first electrode and the ground are disconnected from each other by the first switching circuit, and the first electrode and the second electrode are connected to each other by the second switching circuit, and
    the second state being a state in which the first electrode and the ground are connected to each other by the first switching circuit and the first electrode and the second electrode are disconnected from each other by the second switching circuit,
    wherein the detection of the electrostatic capacitance change in both the first state and the second state is performed sequentially a predetermined number of times, and determination is made that the human body has come into contact with the door handle when the changes in electrostatic capacitance are detected to correspond to the contact of the human body with the door handle in each of the first and second states during the predetermined number of times.

2. The contact sensing device according to claim 1, wherein the first electrode has a surface area larger than that of the second electrode.

3. The contact sensing device according to claim 1, wherein a substance having a dielectric constant larger than that of air is interposed between the first electrode and the second electrode.

4. The contact sensing device according to claim 1, wherein the predetermined number of times is three times.

* * * * *